United States Patent
Yoon et al.

(10) Patent No.: US 7,360,659 B1
(45) Date of Patent: Apr. 22, 2008

(54) SPACE-SAVING MOUNTING FIXTURE FOR USE WITH AN EQUIPMENT RACK

(75) Inventors: Seungyun Yoon, Upper Darby, PA (US); Terry W. Louth, Narvon, PA (US)

(73) Assignee: Unisys Corporation, Blue Bell, PA (US)

( * ) Notice: Subject to any disclaimer, the term of this patent is extended or adjusted under 35 U.S.C. 154(b) by 497 days.

(21) Appl. No.: 10/735,446

(22) Filed: Dec. 12, 2003

(51) Int. Cl.
*F16C 11/04* (2006.01)
*A47F 7/00* (2006.01)

(52) U.S. Cl. .............................. 211/26; 211/4; 211/183; 16/221; 16/326; 248/218.4; 248/221.11; 292/60

(58) Field of Classification Search ................ 211/183, 211/4; 16/50, 68, 49, 221, 229–232, 235, 16/248, 252, 254, 258–260, 268, 319, 321, 16/326; 248/221.11, 222.13, 219.1–219.4, 248/218.4, 289.11; 292/60, DIG. 17; 70/309.2
See application file for complete search history.

(56) References Cited

U.S. PATENT DOCUMENTS

| 379,232 | A | | 3/1888 | Larson | |
|---|---|---|---|---|---|
| 771,877 | A | | 10/1904 | Kuebler | |
| 908,394 | A | * | 12/1908 | Corbeile | 49/162 |
| 910,189 | A | | 1/1909 | Fox | |
| 1,197,420 | A | * | 9/1916 | Wizorek | 16/326 |
| 1,336,433 | A | | 4/1920 | Hudson | |
| 1,494,112 | A | | 5/1924 | Hilger | |
| 1,659,572 | A | | 2/1928 | Klemm | |
| 1,661,113 | A | * | 2/1928 | Deshon | 16/326 |
| 1,730,154 | A | | 10/1929 | Loeb | |
| 1,742,904 | A | | 1/1930 | Follmer | |
| 1,775,877 | A | | 9/1930 | Waples | |
| 1,898,562 | A | * | 2/1933 | More | 292/272 |
| 1,935,246 | A | | 11/1933 | Kirsch | |
| 2,023,826 | A | * | 12/1935 | Van Buskirk | 232/42 |
| 2,182,546 | A | * | 12/1939 | Raymond | 16/328 |
| 2,270,914 | A | | 1/1942 | Williams | |
| 2,293,496 | A | | 8/1942 | Egger | |

(Continued)

FOREIGN PATENT DOCUMENTS

DE 3742813 7/1989

(Continued)

*Primary Examiner*—James A. Kramer
*Assistant Examiner*—Jared W. Newton
(74) *Attorney, Agent, or Firm*—Richard J. Gregson; Robert P. Marley; Gary M. Cohen (57) ABSTRACT

Components can be received within regions of limited access present in an equipment-supporting rack using an installation fixture including a pair of mounting plates which are pivotally connected to each other by a hinge positioned along lateral edges of the respective mounting plates. One mounting plate includes a bracket for fixed connection to the rack, and the other mounting plate includes a surface for receiving a desired component. Rotation of the mounting plate receiving the component relative to the mounting plate fixed to the rack permits the component to be conveniently accessed when servicing is desired, and returned to the region of limited access during normal system operations. A locking mechanism is preferably provided for securing the component and the mounting plate which receives the component in desired position during normal system operations.

20 Claims, 5 Drawing Sheets

U.S. PATENT DOCUMENTS

| Patent No. | | Date | Inventor | Ref. |
|---|---|---|---|---|
| 2,332,291 | A | 10/1943 | Harder Binz | |
| 2,396,242 | A | 3/1946 | Harder Binz | |
| 2,605,153 | A | 7/1952 | Lietz | |
| 2,614,861 | A | 10/1952 | Van Horn | |
| 2,617,473 | A | 11/1952 | Krimstock et al. | |
| 2,650,871 | A | 9/1953 | Holderegger | |
| 2,680,314 | A | 6/1954 | Snyder | |
| 2,727,156 | A | 12/1955 | Guentner et al. | |
| 2,768,043 | A | 10/1956 | Kristoff et al. | |
| 2,851,321 | A | 9/1958 | Malburg | |
| 2,935,287 | A | 5/1960 | Higgins | |
| 2,937,839 | A | 5/1960 | Randolph | |
| 3,192,306 | A | 6/1965 | Skonnord | |
| 3,604,669 | A | 9/1971 | Asher | |
| 3,650,577 | A | 3/1972 | Gutner | |
| 4,564,167 | A * | 1/1986 | Smith | 248/552 |
| 4,697,778 | A | 10/1987 | Harashima | |
| 4,893,747 | A | 1/1990 | Roth | |
| 5,069,408 | A | 12/1991 | Bessinger | |
| 5,079,789 | A | 1/1992 | Jandrakovik | |
| 5,080,322 | A | 1/1992 | Harley | |
| 5,337,682 | A | 8/1994 | Wiseman | |
| 5,400,958 | A | 3/1995 | Walker | |
| 5,425,313 | A | 6/1995 | Rowan | |
| 5,460,105 | A | 10/1995 | Given, Jr. | |
| 5,553,351 | A * | 9/1996 | Starks | 16/223 |
| 5,586,665 | A * | 12/1996 | Brousseau | 211/59.2 |
| 5,671,653 | A | 9/1997 | Martensen et al. | |
| 5,692,815 | A | 12/1997 | Murphy | |
| 5,704,100 | A * | 1/1998 | Swan | 24/656 |
| 5,711,053 | A * | 1/1998 | Hafner | 16/380 |
| 5,887,962 | A | 3/1999 | Tsai | |
| 6,044,984 | A * | 4/2000 | Crosby et al. | 211/70.6 |
| 6,045,098 | A | 4/2000 | Timm | |
| 6,056,378 | A | 5/2000 | Semon et al. | |
| 6,076,846 | A | 6/2000 | Clardy | |
| 6,079,081 | A * | 6/2000 | Padiak et al. | 16/321 |
| 6,086,033 | A * | 7/2000 | Calleja | 248/240 |
| 6,123,203 | A | 9/2000 | Gibbons | |
| 6,158,360 | A | 12/2000 | Cheng | |
| 6,206,495 | B1 | 3/2001 | Peterson | |
| 6,354,550 | B2 | 3/2002 | Jeong | |
| 6,435,462 | B2 | 8/2002 | Hawes | |
| 6,484,987 | B2 | 11/2002 | Weaver | |
| 6,523,223 | B2 * | 2/2003 | Wang | 16/324 |
| 6,568,772 | B2 | 5/2003 | Gerkey et al. | |
| 6,615,744 | B1 | 9/2003 | Eckstein et al. | |
| 6,701,575 | B2 * | 3/2004 | Padiak et al. | 16/309 |
| 6,709,184 | B1 | 3/2004 | McDonald | |
| 6,823,805 | B2 | 11/2004 | Becker | |
| 2004/0034969 | A1 * | 2/2004 | Wegman | 16/389 |

FOREIGN PATENT DOCUMENTS

| | | |
|---|---|---|
| JP | 10 153382 | 6/1998 |

* cited by examiner

SPACE-SAVING MOUNTING FIXTURE FOR USE WITH AN EQUIPMENT RACK

BACKGROUND OF THE INVENTION

This invention generally relates to racks and other types of chassis for receiving equipment, including but not limited to electronic equipment and the like, and more particularly, to a fixture for mounting such equipment in regions which are difficult to access.

Support frames, generally referred to in the industry as "racks", are conventionally used to receive desired electrical components such as circuit boards, modules or similar equipment and to support the received electrical components in desired position. Such racks can either be open, or enclosed to develop a housing (or cabinet) for receiving desired equipment.

Racks of this general type are conventionally comprised of a series of framing elements which are combined to develop an enclosure for the equipment which is to be received in the resulting structure. To this end, a series of brackets is generally connected between a pair of support plates to develop an open enclosure for receiving desired equipment. The brackets are then provided with a series of holes for cooperating with equipment which is to be received in the resulting rack.

In use, electrical equipment which is to be mounted in the rack is positioned between the opposing brackets and is attached to the brackets using conventional hardware. Electrical connections between electrical components mounted in the rack and support components for interfacing with the mounted electrical components (for example, power strips, hub switches, firewalls, etc.) are then established, generally to the rear of the rack.

To facilitate servicing of the electrical equipment mounted in the rack, including any system supporting components, it is often required to access such equipment and the electrical interconnections associated with such equipment through the rear of the rack, between the rearward brackets which comprise the rack. To permit free access to such equipment from the rear of the rack, it is generally necessary for such equipment to be located in regions of the rack where access will not be hampered by any interfering structures. This generally requires support components such as power strips, hub switches and firewalls to occupy regions of the rack which could otherwise be used to receive primary electrical components such as circuit boards, modules or similar electrical components.

Regions exist within the confines of the rack which could otherwise accept the relatively small support components which are used to interface with the remainder of the system, but for the need to be able to conveniently access such components. For example, power strips have at times been placed along the upper and/or lower regions of the rack, regions which are often used to house ducting and fans for ventilating the rack and the equipment mounted in the rack. Such placement avoids the need to position the power strips in regions of the rack which could otherwise be used to receive primary electrical components. However, placement of the power strips along the upper and/or lower regions of the rack has the corresponding disadvantage that significantly longer power cables are then required to connect the power strips with the electrical components which are to be supplied with power for operation. Moreover, some of the more recent racks which have been developed already make use of such space, in such cases preventing components from being positioned in such regions.

It would also be possible for relatively small support components such as power strips, hub switches and firewalls to be located in regions of the rack which are blocked by the support brackets which form the rack, but for the need to have to access the support components which are located in such "blind" spots, which will hereinafter be referred to as areas of "limited access". This would then free remaining space, which is otherwise freely accessible, to receive primary electrical components such as circuit boards, modules and the like.

SUMMARY OF THE INVENTION

In accordance with the present invention, relatively small components can be received within regions of limited access using an installation fixture including a pair of mounting plates which are pivotally connected to each other by a hinge extending along corresponding edges of the respective mounting plates. One of the mounting plates includes a surface for fixed connection to a framing element of the rack, and the other mounting plate includes a surface for receiving a desired component. Rotation of the mounting plate receiving the desired component relative to the mounting plate fixed to the framing element permits the component to be conveniently accessed when servicing is desired, and returned to the region of limited access during normal operations of the system.

A locking mechanism is preferably provided for securing the component and the mounting plate which receives the component in desired position during normal operations of the system.

DETAILED DESCRIPTION OF THE INVENTION

Figure 1:
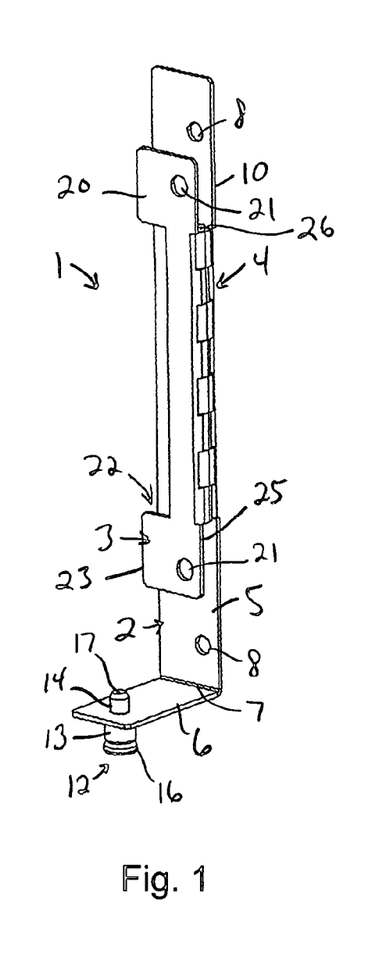
FIG. 1 is an isometric view of a preferred installation fixture of the present invention, in a closed position.
Figure 2:
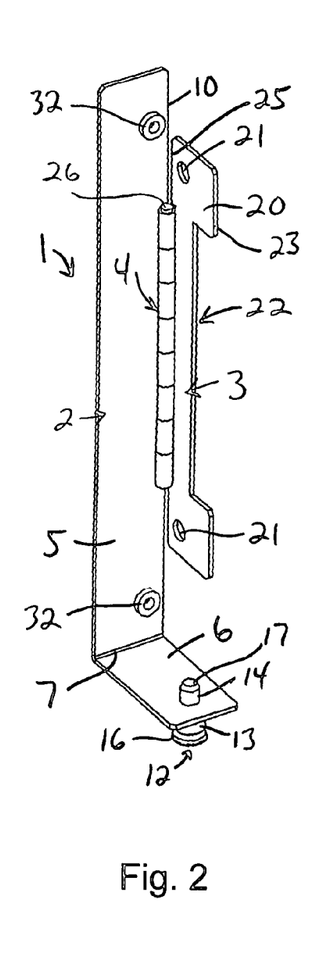
FIG. 2 is an isometric view of the installation fixture of FIG. 1 in an open position.

FIGS. 1 and 2 show a preferred embodiment of the installation fixture 1 of the present invention. In FIG. 1, the installation fixture 1 is shown in a closed, or retracted position. In FIG. 2, the installation fixture 1 is shown in an open, or deployed position. The installation fixture 1 is generally comprised of a pair of mounting plates 2, 3 which are connected by a hinge 4.

Figure 3:
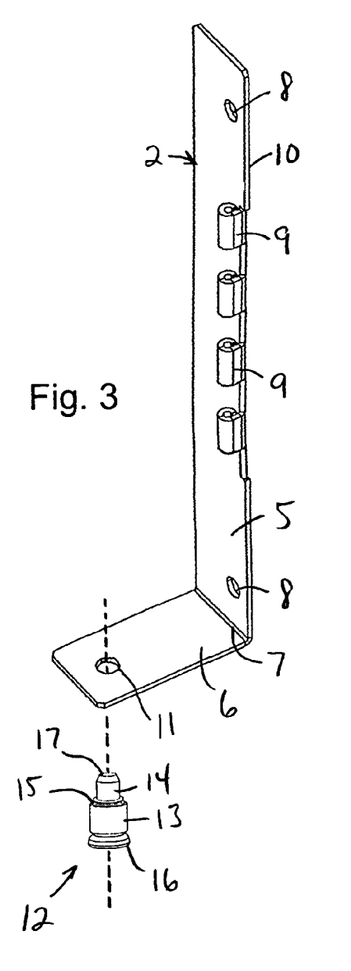
FIG. 3 is an exploded, isometric view of a mounting plate for attaching the installation fixture to a rack.

Referring also to FIG. 3, the mounting plate 2 includes a surface 5 having a flange 6 which extends from a transverse edge 7 of the surface 5. In the configuration illustrated, the surface 5 is planar, with an overall rectangular shape, and one or more apertures 8 are provided in the surface 5 of the mounting plate 2 for receiving conventional hardware for mounting the installation fixture 1 to a rack as will be described tore fully below. A series of barrels 9 for forming the hinge 4 are attached to and extend from a lateral edge 10 of the surface 5.

The flange 6 extends outwardly from the surface 5, preferably normal to the surface 5, and includes an aperture 11 for receiving and cooperating with a locking mechanism 12. The locking mechanism 12 is itself known, and generally includes an outer barrel 13 and an inner plunger 14 separated by a spring 15. The outer barrel 13 is fixed to the flange 6 of the mounting plate 2 so that the plunger 14 extends through the aperture 11. Retraction of the plunger 14, for example, by grasping face portions of the cap 16 of the plunger 14, causes axial retraction of the tip 17 of the plunger 14 toward the aperture 11, against the forces developed by the spring 15, establishing a position for releasing the component attached to the mounting plate 3 for rotation as will be described more fully below. Release of the cap 16 of the plunger 14 permits the tip 17 to resume its passive position, once again extending fully through the aperture 11, and establishing a position for locking the component attached to the mounting plate 3 in a closed position, as will be described more fully below.

Figure 4:
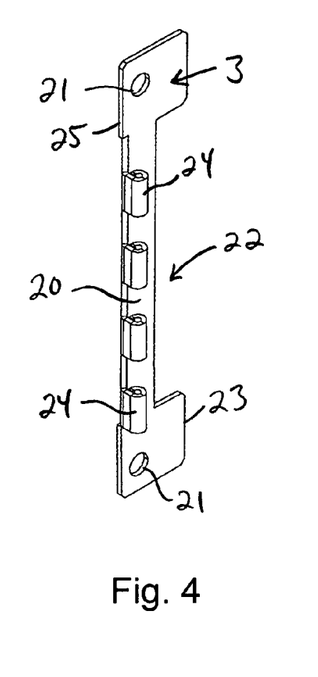
FIG. 4 is an isometric view of a mounting plate for attaching a component to the installation fixture.

Referring also to FIG. 4, the mounting plate 3 includes a surface 20 for receiving desired components as will be described more fully below. In the configuration illustrated, the surface 20 is planar, with an overall rectangular shape, and preferably complements the overall shape and configuration of the mounting plate 2. The surface 20 of the mounting plate 3, and the cooperating surface 5 of the mounting plate 2, are preferably planar in configuration to effectively mate with any of a variety of components. The surface 5 and/or the surface 20 can also have non-planar configurations, and additional openings (not shown) can also be provided, to facilitate the mating of components having irregular shapes with the installation fixture 1. The configuration of the surface 20 will ordinarily complement the configuration of the surface 5, although the use of surfaces 5, 20 having different configurations is equally possible if appropriate to receive a desired component.

In the configuration illustrated, one or more apertures 21 are provided in the surface 20 of the mounting plate 3 for use in securely mounting and supporting a desired component as will be described more fully below. A notch 22 can optionally be formed along a lateral edge 23 of the surface 20, if appropriate to facilitate the cooperation of structure associated with the component with the surface 20 of the mounting plate 3. A series of barrels 24 for forming the hinge 4 are attached to and extend from an opposing lateral edge 25 of the surface 20.

The barrels 9 associated with the mounting plate 2 are joined with the barrels 24 associated with the mounting plate 3 using a connecting pin 26. As a result, the mounting plate 2 and the mounting plate 3 are pivotally connected to each other along a common lateral edge of the respective mounting plates 2, 3. Pivotal connection along the lateral edges 10, 25 of the respective mounting plates 2, 3 is preferred to develop a counter-clockwise rotation of the mounting plate 3 relative to the mounting plate 2 as the mounting plate 3 is deployed. Mirror-image configurations for the surface 5 and the surface 20 can be produced to achieve a clockwise rotation of the mounting plate 3 relative to the mounting plate 2 as the mounting plate 3 is deployed, if desired. The hinge 4 illustrated is centrally located along the lateral edges 10, 25 of the respective mounting plates 2, 3, which is presently preferred for purposes of balance. Other placements for the hinge 4 are also possible, if desired for a particular application.

The plates 2, 3 and the connecting pin 26 can be formed of any of a variety of materials. Plates 2, 3 and a connecting pin 26 formed of metal are preferred, although plastic materials could also be used, if desired.

Figure 5:
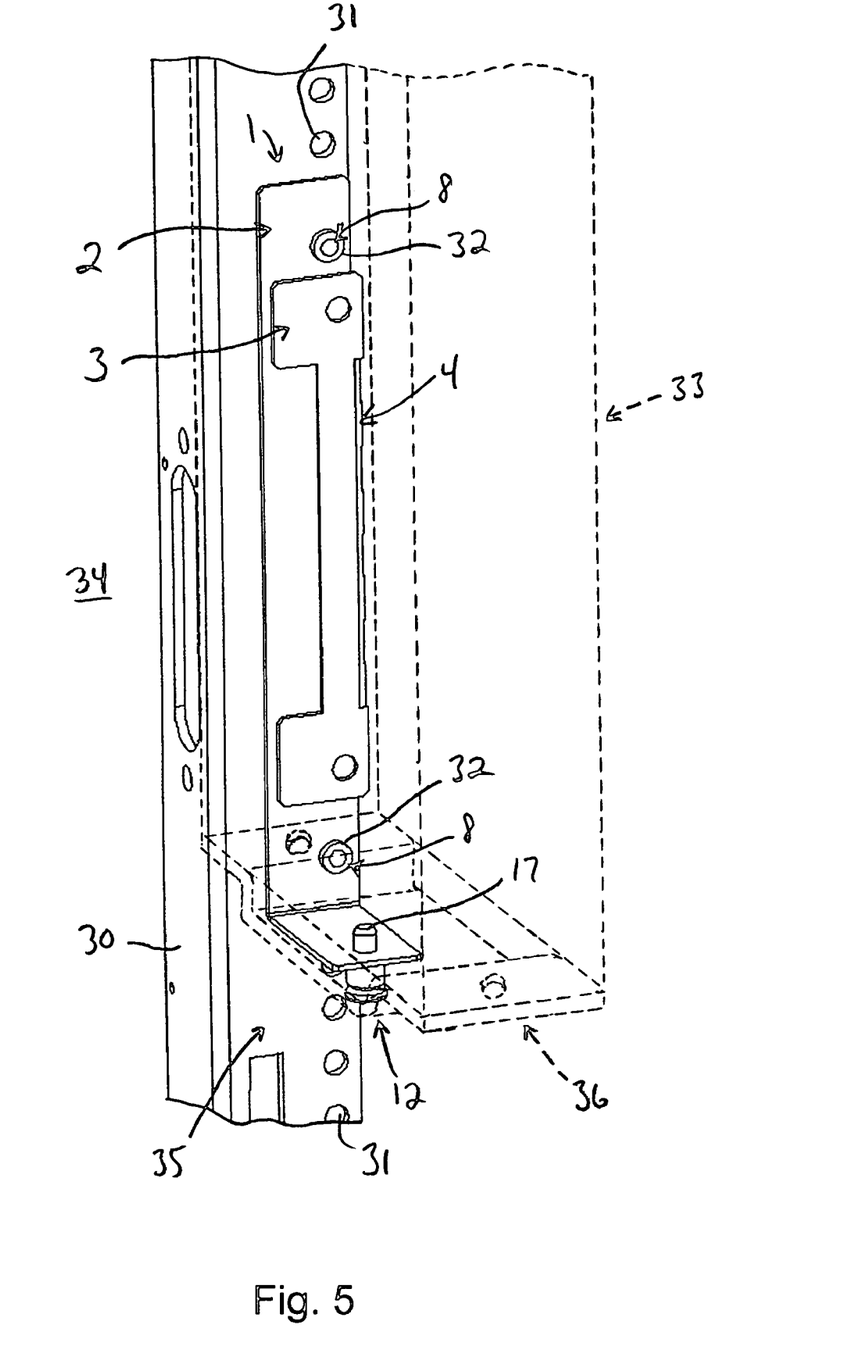
FIG. 5 is an isometric view of an installation fixture mounted to the support bracket of a rack, with the mounting plate for receiving the component in a retracted position.
Figure 6:
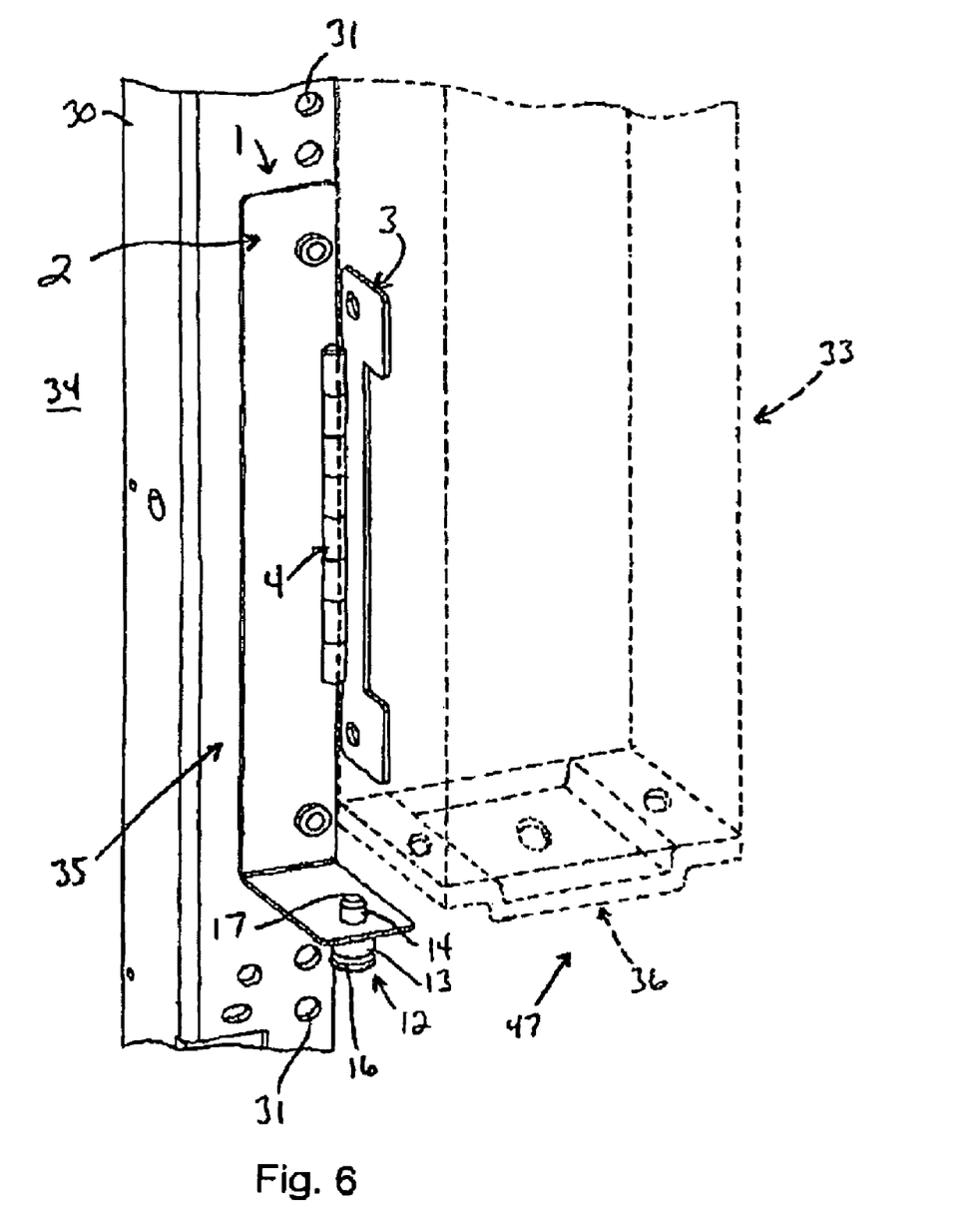
FIG. 6 is an isometric view of an installation fixture mounted to the support bracket of a rack, with the mounting plate for receiving the component in an extended position.
Figure 8:
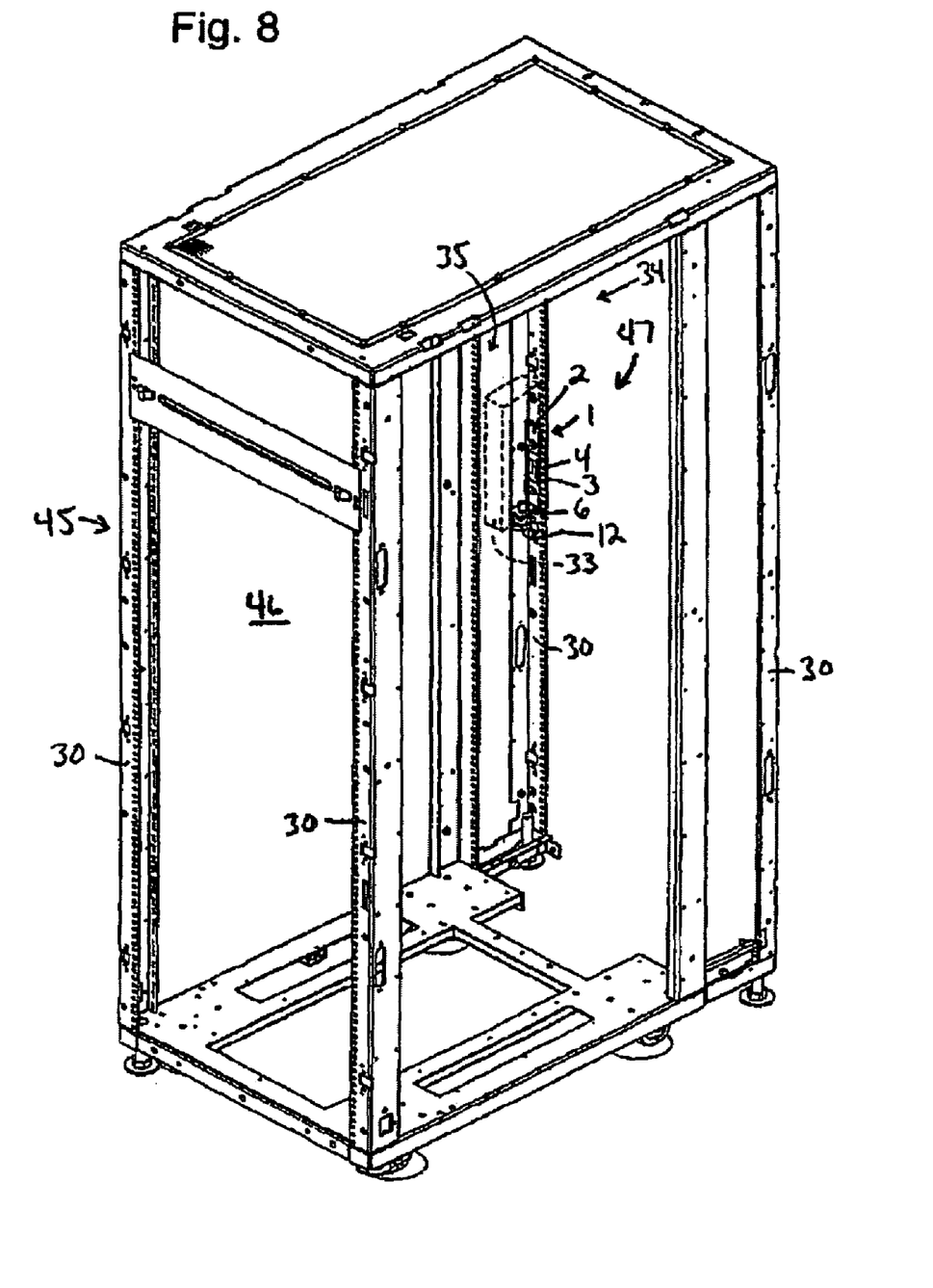
FIG. 8 is an isometric view of a rack for receiving components, including the component and installation fixture shown in FIGS. 5 and 6.

FIGS. 5, 6 and 8 show an installation fixture 1 mounted to one of the supports 30 of a rack 45 for receiving desired components (not shown). The supports 30 have the usual shape of an angle-bracket, and include a series of apertures 31 for receiving conventional hardware (for example, screws, bolts, or other threaded, or other types of fasteners) in conventional fashion. In accordance with the present invention, the installation fixture 1 is positioned on an inside edge of a desired support 30, with the flange 6 facing interior portions 46 of the rack 45 which includes the support 30. When in its desired position, and at its desired height, the apertures 8 in the surface 5 of the installation fixture 1 are aligned with apertures 31 in the support 30, and desired hardware (not shown) is inserted through the apertures 8, 31 to fix the installation fixture 1 to the support 30. The resulting placement of the installation fixture 1 will tend to limit access to the surface 5 and the apertures 8 of the mounting plate 2. To facilitate connection of the installation fixture 1 to the support 30, the apertures 8 can conveniently be provided with threaded bushings 32 to permit a blind connection with the mounting plate 2 of the installation fixture 1, if desired.

As a result, the surface 5 of the mounting plate 2 is brought into engagement with the support 30, providing structural and weight-bearing support for the installation fixture 1 and a component 33 (shown in phantom) received by the installation fixture 1. A side of the component 33 is conveniently fixed to the mounting plate 3 using, for example, conventional hardware engaging the apertures 21 formed in the surface 20 of the mounting plate 3. To be noted is that the hinge 4 will then be located on the side of the installation fixture 1 about which the mounting plate 3 is to rotate, leaving the mounting plate 3 and the component 33 received by the mounting plate 3 free to rotate relative to the fixed mounting plate 2. It will be understood that a mirror-image placement of such structures would be established for an installation fixture which is to be affixed to a support 30 positioned on an opposing side of the rack 45.

Let it now be assumed that a servicing procedure is called for which requires the component 33 mounted to the installation fixture 1 to be accessed. Because such servicing would ordinarily take place from the rear of the rack (from the position 34 shown in FIGS. 5, 6 and 8), the support 30 would then prevent the component 33 from being conveniently accessed when in a region 35 of the interior 46. The installation fixture 1 allows the component 33 to be withdrawn from the region of limited access 35 which then receives the component 33 (FIG. 5) to permit convenient servicing of the component 33 in a region 47 of the interior 46 where free access to the component 33 is permitted (FIG. 6).

Figure 7:
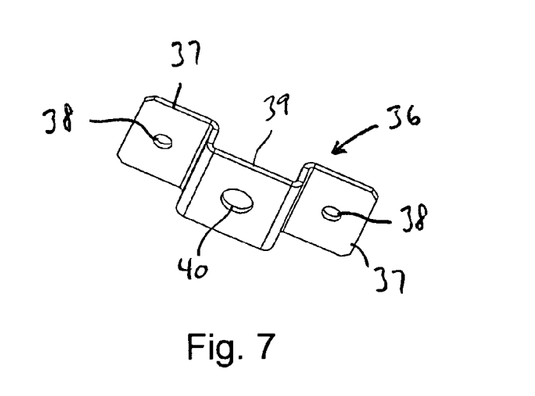
FIG. 7 is an isometric view of a bracket for engagement by the locking mechanism of the installation fixture.

To accomplish this, the cap 16 of the plunger 14 of the locking mechanism 12, if used, is grasped and pulled down. This operates to retract the tip 17 of the plunger 14, releasing the component for movement relative to the fixed mounting plate 2 of the installation fixture 1. To this end, the tip 17 of the plunger 14 can directly engage portions of the component, either frictionally or by interacting with structural features of the component. Referring also to FIG. 7, a bracket 36 can be provided to develop a more positive connection with the component, if desired. Opposing ends 37 of the bracket 36 include an aperture 38, for attachment to the component 33 as shown in FIGS. 5 and 6 using conventional hardware. An offset portion 39 of the bracket 36 has an aperture 40 which can receive the tip 17 of the plunger 14, for positive interaction with the locking mechanism 12.

The component 33, or the mounting plate 3, is grasped and rotated outwardly about the hinge 4 to assume a deployed position, as shown in FIG. 6. As a result, and referring to FIG. 8, the component 33 is moved from a position located within the region of limited access 35 to a position located within the region 47 in which the component 33 can be freely accessed. Free travel of the component 33 about the hinge 4 is enabled by the cooperation between the mounting plate 2 and the mounting plate 3, allowing the component to travel along an extended arc which permits the component to be deployed at an angle which is convenient for servicing.

Convenient servicing of the component 33 can then proceed, as desired, with the component 33 (and the mounting plate 3) in an orientation which laterally projects from the region 35.

Following desired servicing of the component 33, the component 33 is conveniently pushed back, rotating about the hinge 4. In this way, the component 33 will be returned to the region 35, which could not otherwise be accessed because of the blocking support 30, and which could not otherwise be used to receive a component requiring any servicing. If a locking mechanism 12 is employed, the cap 16 of the plunger 14 would be grasped and retracted as the component 30 is returned to the region 35, serving to lock the component 33 in the retracted position. Again, the tip 17 of the plunger 14 can either directly engage portions of the component 33, or enter the aperture 40 of the bracket 36 attached to the component 33, if used, to secure the returned component 33 within the region 35.

It will be understood that various changes in the details, materials and arrangement of parts which have been herein described and illustrated in order to explain the nature of this invention may be made by those skilled in the art within the principle and scope of the invention as expressed in the following claims.

What is claimed is:

1. A fixture for mounting a component to a rack for supporting a plurality of components, comprising:
   a first plate having a surface for receiving the component;
   a second plate having a surface for attachment to the rack and cooperating with the first plate to form a combination of mounting plates, and a flange extending from a transverse edge of the surface of the second plate;
   wherein the first plate is pivotally connected to the second plate so that, in a first position, the first plate is adjacent to and in substantial alignment with the second-plate and, in a second position, the first plate is rotated to an orientation which laterally projects from the second plate;
   a locking mechanism fixed to the flange of the second plate, wherein the locking mechanism includes an axially retractable tip which is movably coupled with the flange of the second plate, and a cap having graspable face portions coupled with the tip for manual retraction of the tip, for selectively engaging the component received by the first plate; and
   a bracket for association with the component received by the first plate and spaced from the fixture, for selective engagement by the tip of the locking mechanism.

2. The fixture of claim 1 wherein the second position of the first plate forms an angle with the second plate.

3. The fixture of claim 1 wherein the first plate is pivotally connected to the second plate by a hinge which operatively connects the mounting plates.

4. The fixture of claim 3 wherein the hinge is positioned along lateral edges of the mounting plates.

5. The fixture of claim 3 wherein the first plate and the second plate have a substantially rectangular shape.

6. The fixture of claim 5 wherein the first plate includes a notch formed in an edge of the first plate which opposes the hinge.

7. The fixture of claim 1 wherein the tip of the locking mechanism extends through an aperture formed in the flange of the second plate, for selectively engaging the component received by the first plate.

8. A fixture in combination with a component and a rack for supporting a plurality of components, for mounting the component to the rack, wherein the rack is comprised of a plurality of supports which combine to define an interior region located between the plurality of supports, for receiving the plurality of components, wherein the interior region includes first portions for freely accessing the components, and second portions defining an area of limited access which is at least partially blocked by the supports of the rack, and wherein the fixture comprises:
   a first plate associated with the fixture having a surface which receives the component; and
   a second plate associated with the fixture having a surface attached to the rack and cooperating with the first plate to form a combination of mounting plates;
   wherein the first plate is pivotally connected to the second plate by a hinge which operatively connects the mounting plates so that, in a first position, the first plate is located within the second portions of the interior region defined by the plurality of supports, adjacent to and in substantial alignment with the second plate and, in a second position, the first plate is rotated to an orientation which laterally projects from the second plate and which is located within the first portions of the interior region defined by the plurality of supports.

9. The fixture of claim 8 wherein the hinge is positioned along lateral edges of the mounting plates.

10. The fixture of claim 8 wherein the second position of the first plate forms an angle with the second plate.

11. The fixture of claim 8 wherein the first plate and the second plate have a substantially rectangular shape.

12. The fixture of claim 11 wherein the first plate includes a notch formed in an edge of the first plate which opposes the hinge.

13. The fixture of claim 8 wherein the second plate further includes a flange extending from a transverse edge of the surface of the second plate.

14. The fixture of claim 13 which further includes a locking mechanism fixed to the flange of the second plate.

15. The fixture of claim 14 wherein the locking mechanism includes a tip which is movably coupled with the flange of the second plate, to selectively engage the component received by the first plate.

16. The fixture of claim 15 which further includes a bracket connected to the component, wherein the bracket has an aperture for receiving the tip of the locking mechanism.

17. The fixture of claim 15 therein the tip of the locking mechanism extends through an aperture formed in the flange of the second plate.

18. The fixture of claim 8 wherein the second plate further includes at least one aperture which receives hardware connecting the second plate to the rack so that the second plate is located within the second portions of the interior region defined by the plurality of supports.

19. The fixture of claim 8 wherein the component is supported by the first plate and the second plate within the second portions of the interior region defined by the plurality of supports when the first plate is in the first position.

20. The fixture of claim 8 wherein the first plate is connected to a side of the component.

* * * * *